United States Patent
Fautz

(10) Patent No.: US 9,897,674 B2
(45) Date of Patent: *Feb. 20, 2018

(54) METHOD AND MAGNETIC RESONANCE APPARATUS TO DETERMINE A B0 FIELD MAP

(71) Applicant: Siemens Aktiengesellschaft, Munich (DE)

(72) Inventor: Hans-Peter Fautz, Forchheim (DE)

(73) Assignee: Siemens Aktiengesellschaft, Munich (DE)

( * ) Notice: Subject to any disclaimer, the term of this patent is extended or adjusted under 35 U.S.C. 154(b) by 854 days.

This patent is subject to a terminal disclaimer.

(21) Appl. No.: 14/328,963

(22) Filed: Jul. 11, 2014

(65) Prior Publication Data

US 2015/0015257 A1   Jan. 15, 2015

(30) Foreign Application Priority Data

Jul. 11, 2013   (DE) .................. 10 2013 213 591

(51) Int. Cl.
  *G01R 33/44*   (2006.01)
  *G01R 33/24*   (2006.01)
  *G01R 33/565*  (2006.01)

(52) U.S. Cl.
  CPC ......... *G01R 33/443* (2013.01); *G01R 33/243* (2013.01); *G01R 33/56563* (2013.01)

(58) Field of Classification Search
  USPC ................... 324/300–322; 600/407–435; 382/128–131
  See application file for complete search history.

(56) References Cited

U.S. PATENT DOCUMENTS

| 4,609,872 A * | 9/1986 | O'Donnell | G01R 33/56308 324/306 |
| 7,064,547 B1 * | 6/2006 | King | G01R 33/5611 324/309 |
| 7,898,254 B2 * | 3/2011 | Feinberg | G01R 33/4818 324/309 |

(Continued)

OTHER PUBLICATIONS

Wu et al., "accurate B0 Mapping with an Adaptive Algorithm Integrating KESA, PRELUDE, and Time-Domain Phase Unwrapping," Proc. Intl. Soc. Mag. Reson. Med. 20 p. 2506 (2012).

(Continued)

*Primary Examiner* — Melissa Koval
*Assistant Examiner* — Tiffany Fetzner
(74) *Attorney, Agent, or Firm* — Schiff Hardin LLP

(57) ABSTRACT

In a method and magnetic resonance apparatus to determine a B0 field map describing the local deviation from a nominal Larmor frequency of the magnetic resonance apparatus, magnetic resonance data are acquired at at least two different dephasing times after an excitation, in measurements implemented at two different echo times whose difference forms a dephasing time, and a phase change used to determine the B0 field map is determined from a difference of phases measured at different echo times. The phase changes of different dephasing times are evaluated to at least partially reduce an ambiguity due to Nyquist phase wrapping. The measurements for different dephasing times are implemented at least in part with excitations that generate different excitation fields.

12 Claims, 2 Drawing Sheets

(56) References Cited

U.S. PATENT DOCUMENTS

| | | | |
|---|---|---|---|
| 8,934,694 B2* | 1/2015 | Chen | G06T 11/008 |
| | | | 382/131 |
| 2002/0033699 A1 | 3/2002 | Toufaily et al. | |
| 2004/0027127 A1 | 2/2004 | Mills | |
| 2007/0085537 A1 | 4/2007 | Feiweier | |
| 2009/0121714 A1 | 5/2009 | Feiweier | |
| 2009/0212773 A1* | 8/2009 | Feinberg | G01R 33/4818 |
| | | | 324/309 |
| 2009/0230957 A1 | 9/2009 | Park | |
| 2009/0256567 A1 | 10/2009 | Aksit et al. | |
| 2012/0049846 A1 | 3/2012 | Gross et al. | |
| 2013/0182932 A1* | 7/2013 | Chen | G01R 33/56509 |
| | | | 382/131 |
| 2013/0207655 A1 | 8/2013 | Biber | |
| 2013/0214782 A1 | 8/2013 | Fautz | |
| 2015/0015257 A1* | 1/2015 | Fautz | G01R 33/443 |
| | | | 324/309 |
| 2015/0015258 A1* | 1/2015 | Fautz | G01R 33/246 |
| | | | 324/309 |
| 2015/0077115 A1* | 3/2015 | Fautz | G01R 33/443 |
| | | | 324/318 |
| 2015/0204955 A1* | 7/2015 | Gumbrecht | G01R 33/4828 |
| | | | 324/322 |

OTHER PUBLICATIONS

De Sousa et al., "Simultaneous $B_1+$ and $B_0$ Mapping using Dual-Echo Bloch-Siegert (DEBS) Sequence," Proc. Intl. Soc. Mag. Reson. Med 20 p. 2505 (2012).

\* cited by examiner

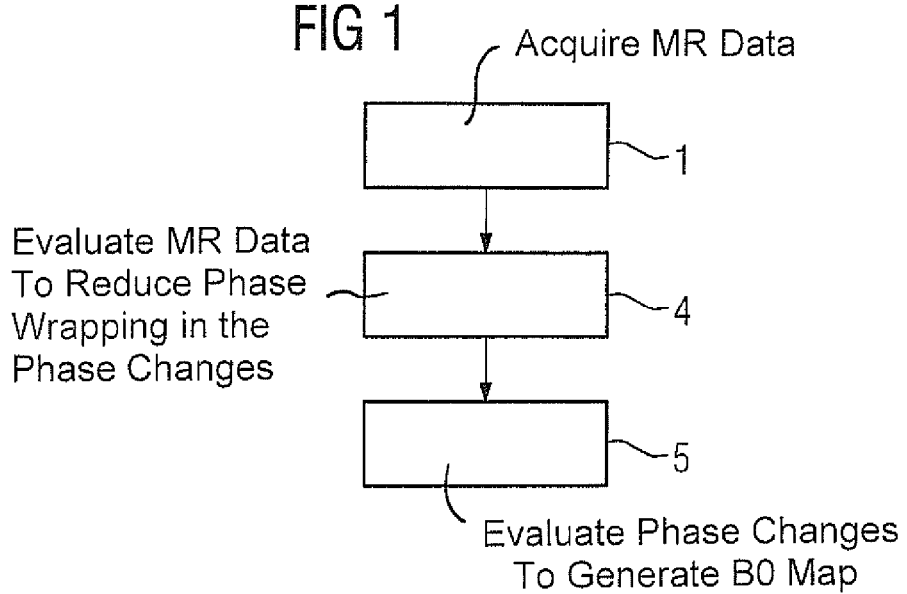
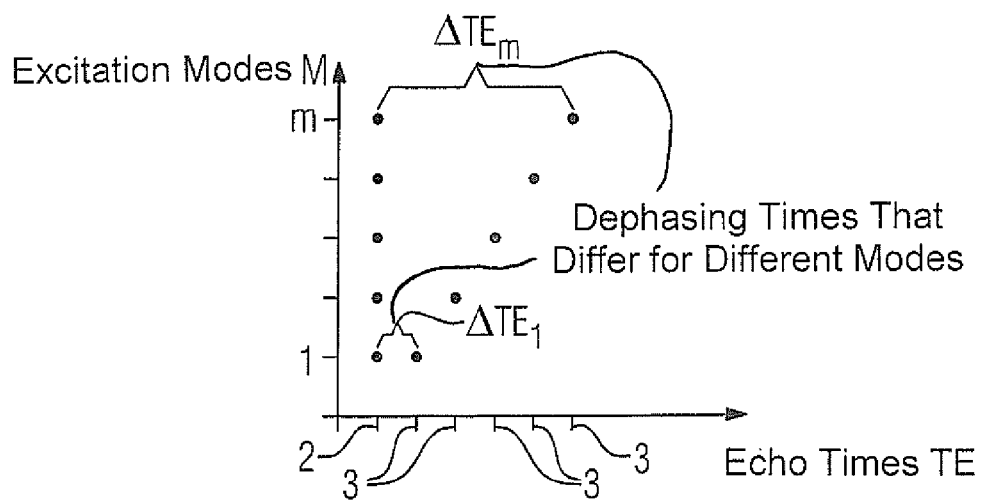

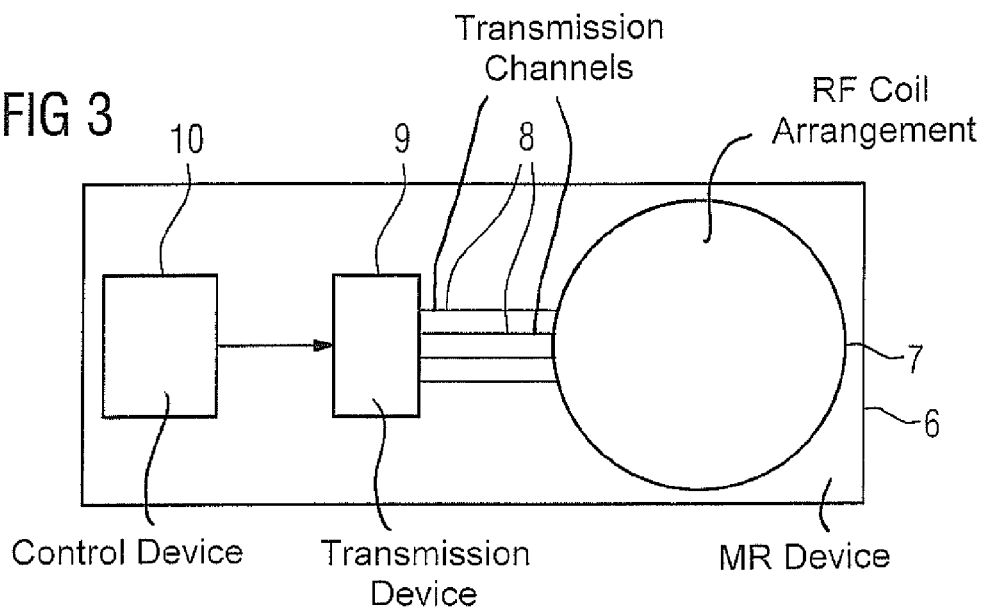
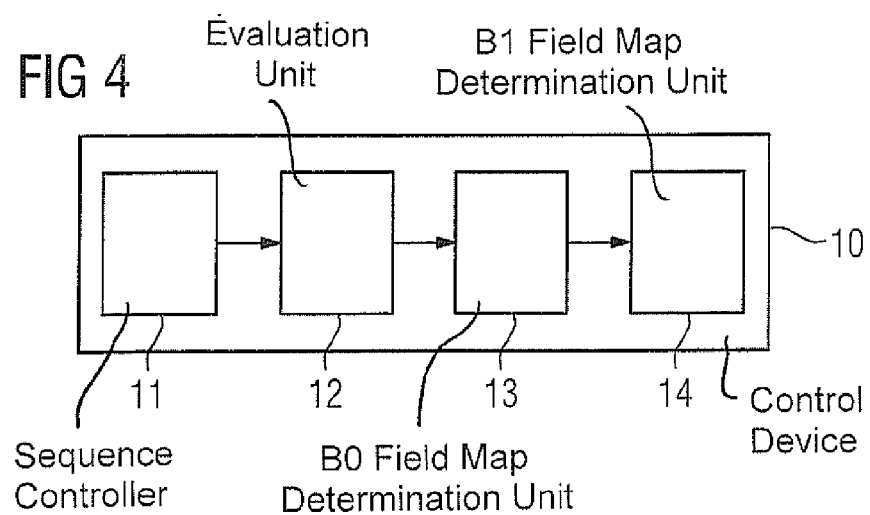

METHOD AND MAGNETIC RESONANCE APPARATUS TO DETERMINE A B0 FIELD MAP

BACKGROUND OF THE INVENTION

Field of the Invention

The present invention concerns a method to determine a B0 field map that describes the local deviation from a nominal Larmor frequency of a magnetic resonance device, wherein magnetic resonance data are acquired in measurements implemented at two different echo times whose difference forms a dephasing time, after an excitation at at least two different dephasing times; and a phase change to be used to determine the B0 field map is determined from a difference of phases measured at different echo times; wherein the phase changes of different dephasing times are evaluated for at least partially reducing an ambiguity due to Nyquist phase wrapping.

Description of the Prior Art

Magnetic resonance imaging and its basic operation are widely known in the prior art. A subject to be examined is introduced into a basic magnetic field with a relatively high field strength (known as the B0 field). In order to be able to acquire magnetic resonance data, for example in a slice of a subject, the nuclear spins of this slice are excited and the decay of this excitation is detected as a signal, for example. Gradient fields can be generated by a gradient coil arrangement while radio-frequency excitation pulses (which are frequently designated as radio-frequency pulses) are emitted via a radio-frequency coil arrangement. The entirety of the radio-frequency pulses (excitation) generates a radio-frequency field that is typically designated as a B1 field, and the spins of resonantly excited nuclei are deflected (with a spatial resolution due to the gradients) by an angle known as a flip angle relative to the magnetic field lines of the basic magnetic field. The excited spins of the nuclei then radiate radio-frequency signals that can be acquired and processed further by suitable reception antennas (such as by the radio-frequency coil arrangement itself) in order to thus be able to reconstruct magnetic resonance image data therefrom.

Conventional radio-frequency coil arrangements are operated in a mode known as the "homogeneous mode", for example in a CP mode (circularly polarized mode), wherein a single radio-frequency pulse is emitted with a defined, fixed phase and amplitude to all components of the transmission coil, for example all transmission rods of a birdcage antenna. To increase flexibility and to achieve new degrees of freedom to improve the imaging, it has been proposed to also enable a mode known as a parallel transmission (pTX), in which multiple transmission channels of a radio-frequency coil arrangement are individually charged with individual pulses that can deviate from one another. This entirety of the individual pulses (which, for example, can be described via the parameters of phase and amplitude) is then defined as a whole in a control sequence (protocol) that is described by a corresponding parameter set. Such a multi-channel pulse (excitation) that is composed of individual pulses for the different transmission channels is often designated as a "pTX pulse" (for "parallel transmission"). In addition to the generation of spatially selective excitations, field inhomogeneities can also be compensated (for example within the scope of "RF shimming").

In order to determine control parameter sets of a control sequence, it is necessary to know the background (thus the B0 field), as well as the effects of the individual transmission channels in the imaging region (in particular the homogeneity volume).

For measurement of the basic magnetic field (B0 field)—designated as a B0 mapping—first magnetic resonance data are typically acquired (preferably by gradient echo imaging) at two different echo times. The phase difference (phase change) of the magnetic resonance data acquired at different echo times (which can be determined by subtraction of the phases of two magnetic resonance images of the first magnetic resonance data that are acquired at different echo times) is proportional to a deviation of the local B0 field from the nominal basic magnetic field strength and to the dephasing time (thus the difference of the two echo times). The field deviation is thereby specifically described by a deviation of the Larmor frequency from a nominal Larmor frequency of the magnetic resonance apparatus (a value describing this deviation is designated as a Larmor frequency value in the following).

The phase generated by deviations in the homogeneity of the B0 field thus develops over time. The effect of the Nyquist phase wrapping must be taken into account because the proportionality of the phase difference of magnetic resonance data acquired at different times to the deviation from the nominal Larmor frequency, and to the difference of the echo times, applies only as long as the phase difference (limited to $2\pi$) corresponds to the actual phase evolution. However, the phases can be further developed by multiples of $2\pi$ depending on the dynamic range of the B0 distribution. This leads to ambiguities and errors in the calculation of the B0 maps. Incorrect associations in the phase evolution show themselves in non-physical spatial discontinuities due to the $2\pi$ jumps in the phase difference images. This means that an extremely fast development of the B0 phase also occurs if the deviation of the local Larmor frequency from the nominal Larmor frequency is high, such that the phase will go beyond $2\pi$ when the echo time (here the difference of the two echo times) is not short enough, such that the described ambiguity occurs.

The selection of extremely short dephasing times is frequently not possible due to the sequences that are used, and so smaller deviations from the nominal Larmor frequency can no longer be measured with sufficient precision given an extremely short echo time difference.

A few approaches are known in the prior art to solve the ambiguity problem in the association of the measured phase change. It is thus possible to choose the dephasing time (thus the difference of the echo times) to be so short that the phases do not develop by more than $2\pi$ at any location during them. However, since the dynamic range of the B0 field distribution is not known before the measurement, the dephasing time must be chosen to be so short that the sensitivity of the acquisition method is not sufficient, and this procedure is consequently not used (as has already been explained).

Therefore, it was proposed to detect and correct phase jumps in the B0 maps in a post-processing, under the assumption that the B0 field is spatially continuous. Algorithms that have this effect are designated as phase unwrapping algorithms. However, the reliability of such algorithms is often questionable. The primary difficulty exists in that the entire volume can be comprised of non-contiguous partial regions, such that individual partial regions of the B0 maps are separated by voxels that only include noise and are very low in signal. The phase in these voxels can thus not be determined, or can only be determined unreliably.

It has also been proposed to iteratively acquire first magnetic resonance data with increasing dephasing time, consequently increasing difference between the echo times. The shortest dephasing time is thereby selected so that no spatial phase jumps occur. Whether a phase jump will occur given longer dephasing time is estimated from the acquisitions with shorter dephasing times. If this is the case, this is taken into account in the evaluation (reconstruction) of the first magnetic resonance data with longer dephasing time. The phase ambiguity is therefore dispelled, and long dephasing times are enabled for a high sensitivity.

A further alternative procedure is to minimize the phase gradients between adjacent voxels in the B0 maps. Given this solution, the B0 maps do not necessarily need to be corrected for phase jumps. However, the risk exists that a calculated B0 shim is optimized for false B0 offsets in different spatial areas. Moreover, no frequency (zeroth order shim) can be calculated from differential method.

Corresponding mapping processes are also known for B1 fields and are designated as "B1 mapping". Generally speaking, B1 field maps are acquired for each transmission channel, which means that the B1 field maps show how strong the B1 field is at a specific location in the imaging region given a specific excitation (for example a uniform excitation and/or given a defined transmitter voltage). This means that a complex B1 value (consequently a B1 amplitude and a B1 phase, which can also be differentiated in a B1 amplitude map and a B1 phase map) is associated with each voxel (image point). Typically, measurements for a number of excitation modes are conducted, wherein an excitation mode does not necessarily need to correspond to the operation of only one channel; rather, combinations are also conceivable from which the individual transmission channels can then be concluded.

In order to determine the amplitude of the B1 field, for example, it is known to measure the flip angle that a radio-frequency pulse causes, wherein reference is made to DE 10 2005 049 229 B3 as an example. An excitation mode thereby results in a constant phase shift (consequently a constant B1 field), wherein the B0 phase continuously varying over time (as it has been described) is, however, naturally also acquired as well in the phase measurement. Therefore, for B1 mapping it is known to use basically the same echo time for the different excitation modes, such that the effect of the B0 field on the phases is kept constant, such that a raw phase map obtained from the magnetic resonance data of one excitation mode can be used as a correction so that the stable effect of the B0 field on the phase cancels out, and consequently the phases of the excitation mode used for correction serve as a reference phase map. This means that all other B1 phase maps are defined relative to the B1 phase map used as a correction, which is, however, not problematic since it ultimately depends anyway only on the relative phases of the different transmission channels.

SUMMARY OF THE INVENTION

An object of the present invention is to provide a method to determine a qualitatively higher-grade, more reliable B0 field map, compared to known methods.

To achieve this object, in a method of the aforementioned type, the measurements for different dephasing times according to the invention are implemented at least in part with excitations generating different excitation fields.

The insight on which the invention is based is that one of the main problems in the determination of B0 field maps is the sensitivity of the underlying excitation. If a radio-frequency coil arrangement that is controllable via multiple transmission channels is assumed for which phase and amplitude can be selected independently, for excitations are generally created that have lower sensitivity in some regions than in others, such that acquired B0 data can have a large error—such as a low signal-to-noise ratio—particularly given extremely short dephasing times. The use of excitations that result in different excitation fields (and thus also different phase distributions) in the imaging region as a starting point consequently covers overall a wider sensitivity range and additionally provides the advantage of more independent measurements, which contributes to an improvement of the quality when the partial results for individual dephasing times are statistically combined to form a complete B0 map. The use of the present invention is particularly appropriate when measurements for excitations generating different excitation fields are implemented anyway with a different goal, such that (as presented in detail in the following) the measurement of the magnetic resonance data for the B0 map is implemented (as is preferable) simultaneously with measurements within the scope of a B1 mapping, in which B0 field maps with complex fields should be acquired for different transmission channels of the radio-frequency coil arrangement. A common measurement of B1 field maps and B0 field maps is then possible.

Effects due to the Nyquist phase wrapping (namely ambiguities due to $2\pi$ phase jumps) are markedly reduced since an incorrect association of phase changes with the actual phase evolution is avoided. Short dephasing times are suitable in order to estimate whether Nyquist phase wrapping could occur in the case of longer dephasing times. This can be taken into account again in the evaluation of magnetic resonance data at longer dephasing times.

As already noted, it is particularly appropriate for the complete set of excitations to essentially homogeneously cover an imaging region of the magnetic resonance device and/or when a predetermined minimum signal strength is exceeded for at least one excitation for each voxel of the imaging region. This ensures that an actual qualitative improvement of the B0 field map occurs since at least one reliable measurement value is present at every relevant position (each voxel) in the imaging region of the magnetic resonance device. If the evaluation results for different dephasing times, or different pairs of magnetic resonance data that were acquired at different echo times, are statistically combined into a common B0 field map, a weighting with the signal-to-noise ratio (or, in the event that this is not present, with the signal strength) can then take place. Extremely high-quality and reliable B0 field maps are thus achieved. Such constituent B0 field maps that are to be combined are preferably always created for echo times that were measured in the same excitation. These constituent B0 field maps can be combined with weighting, for example via a weighted mean calculation per voxel, wherein as described the weighting can take place according to the signal-to-noise ratio (SNR) or the signal strength.

In an embodiment of the present invention, a radio-frequency coil arrangement with multiple, independently controllable transmission channels is used, and the magnetic resonance data are acquired in a measurement procedure serving for the determination of B1 maps for the transmission channels. It is particularly appropriate for at least two measurements to be implemented at different echo times for each excitation mode used in the measurement procedure, with the dephasing times differing for at least two (in particular all) different excitation modes.

As described above, in addition to B0 field maps, B1 field maps for the individual transmission channels are also required for magnetic resonance devices with radio-frequency coil arrangements that have multiple transmission channels (thus what are known as pTX systems). To obtain the B1 field maps, multiple measurements are implemented because at least n acquisition procedures (repetitions) are required for B1 mapping of n transmission channels. These acquisition processes each use a different excitation mode that generates a different excitation field. A B1 field map can then be computationally back-calculated from these for all transmission channels.

The different B1 mapping methods always also allow the acquisition of a second gradient echo, such that the magnetic resonance data can be acquired for a B0 magnetic resonance data. In the described preferred procedure according to the invention, n constituent B0 field maps of the same B0 distribution are thus created, which all use different dephasing times.

For radio-frequency coil arrangements with multiple transmission channels, the present invention consequently allows at least one respective additional echo to be acquired at a second echo time together with the different acquisitions to map the B1 transmission fields, wherein the dephasing time changes between the echoes, in particular for each of the acquisitions. This means that B0 field maps with different dephasing times (constituent B0 field maps) can be obtained from each B1 mapping exposure by the acquisitions with different excitation modes but different echo time being evaluated in pairs. As explained above, phase jumps for longer dephasing times can be estimated from the different dephasing times, and the phase evolution can be determined unambiguously from the phase changes. A statistical combination of the constituent B0 field maps can then also take place, as has been described.

The combined acquisition of B1 field maps and B0 field maps is possible with each B1 mapping method. In particular, the common acquisition is suitable for simple, gradient echo-based methods, for example the acquisition of relative B1 field maps in which only one gradient echo image is acquired per excitation mode, the AFI (actual flip angle imaging), in which two gradient echo images are acquired with different repetition times per excitation mode, the double angle method, in which at least two gradient echo images are acquired with different flip angle per excitation mode, and other B0 mapping methods.

Absolute B0 field maps are thus acquired together with B1 field maps or relative B1 field maps of pTX systems, which absolute B0 field maps are in principle not limited in terms of their sensitivity due to limited dephasing time and exhibit no spatial jumps that arise due to $2\pi$ phase jumps and incorrect association of phase changes with the actual phase evaluation.

In an embodiment of the invention, the excitation modes use more than one transmission channel, such that the dynamic range of the B1 amplitudes is reduced relative to the use of a single transmission channels. This means that those B1 mapping methods that limit the dynamic range of the B1 distribution (and therefore the amplitude signal variation) are particularly suitable for reliable determination of the B0 field map. This is efficiently achieved by—as has been explained—B1 field maps of different combinations of the transmission channels being acquired, and the B1 field maps of the transmission channels are computationally determined therefrom.

It is noted that the use of gradient echo sequences are generally suitable for the acquisition of the magnetic resonance data in the method according to the invention.

In addition to the method according to the invention, the invention also encompasses a magnetic resonance apparatus having a control device designed to implement the method according to the invention. In addition to a radio-frequency coil arrangement with multiple independently controllable transmission channels, a control device is consequently provided that determines the B0 field maps according to the method according to the invention. For example, such a control device can have a sequence controller that controls other components of the magnetic resonance device to acquire the magnetic resonance data given two different echo times for excitations generating different excitation fields. An evaluation unit can also be provided that determines phase changes for the different dephasing times and evaluates them for at least partial reduction of the ambiguity due to a Nyquist phase wrapping. The results can be forwarded to a B1 field map determination unit that statistically combines the sub-B0 field maps (preferably with weighting) originating from the different dephasing times in order to obtain the B0 field map. It is significant that the sequence controller at least in part uses excitations generating different excitation fields for different dephasing times.

All advantages noted with regard to the method according to the invention apply analogously to the magnetic resonance device according to the invention.

The method according to the invention can also be realized as a non-transitory, computer-readable storage medium encoded with programming instructions the method according to the invention to executed by a computer in which the storage medium is loaded.

BRIEF DESCRIPTION OF THE DRAWINGS

FIG. 1 is a flowchart for an exemplary embodiment of the method according to the invention.

FIG. 2 is a schematic illustration to explain the exemplary embodiment.

FIG. 3 shows a magnetic resonance device according to the invention.

FIG. 4 is a block diagram of the control device of the magnetic resonance device of FIG. 3.

DESCRIPTION OF THE PREFERRED EMBODIMENTS

An exemplary embodiment of the method according to the invention is shown in FIG. 1. The basic goal is to qualitatively improve the determination of a B0 field map, wherein magnetic resonance data are based on different dephasing times, and the different dephasing times are used to resolve ambiguities due to Nyquist phase wrapping, in that different phase distributions are used as a starting point for different dephasing times (excitations generating different excitation fields are consequently used for different dephasing times). This can be realized particularly simply by acquiring the B0 field map together with B1 field maps, which is realized in the exemplary embodiment according to FIG. 1, and is implemented in step 1.

In accordance with the invention, n excitation modes are used, from the evaluation of which B1 field maps are then be calculated for the different transmission channels of a radio-frequency coil arrangement of the magnetic resonance device (as is known in the prior art). However, in step 1 not only is a measurement made at a single echo time, but rather two echo times are measured for each excitation mode, such that magnetic resonance data exist that are associated with a specific dephasing time defined by the difference of the first echo time and second echo time.

This measurement principle is explained in detail using FIG. 2. The echo time TE is symbolically plotted there against the excitation mode M. A measurement is clearly respectively implemented for each excitation mode M from 1 to m (wherein m reflects the number of excitation modes) at a first echo time 2 and at a second echo time 3 in order to acquire the magnetic resonance data. The same first echo time 2 is in fact thereby used for all excitation modes, wherein these can also be different in other exemplary embodiments. The second echo times 3 at which the second measurement thus occurs are always different, such that both short dephasing times $\Delta TE_1$ and long dephasing times (for example $\Delta TE_m$ in FIG. 2) and values between these are used.

In an evaluation step 4, an evaluation of the magnetic resonance data is initially implemented in order to identify and resolve the ambiguities due to phase wrapping. For example, starting from the short dephasing times a check is made as to whether a Nyquist phase wrapping is to be expected at longer dephasing times in that the phase changes that result from the magnetic resonance data of the measurement pairs are considered, wherein Nyquist phase wrapping can also be determined by considering the phase changes at a voxel for different dephasing times on an optimally broad basis. Nyquist phase wrapping is established if the ambiguity is eliminated, and a correction occurs of the phase changes derived from the longer dephasing times (in which the Nyquist phase wrapping occurs).

In step 5, the phase changes respectively determined given the excitation modes with different dephasing times are then evaluated further in order to obtain a constituent B0 field map for each excitation mode. The constituent B0 field maps are statistically combined in Step 5 in order to obtain a B0 field map as a final result. For example, a mean calculation across the constituent B0 field maps can take place in which a weighting takes place using the respective SNR or the respective signal strength.

Not depicted in FIG. 1 is the fact that B1 field maps are naturally also determined in a known manner. It is noted that naturally all acquired magnetic resonance data can also be used to determine the B1 field maps, which means that constituent B1 field maps for the first echo time 2 and the second echo time 3 can initially be determined for each excitation mode, which sub-B1 field maps can then likewise be statistically combined.

A variety of B1 mapping methods (as already described above) can be used to acquire the magnetic resonance data. In each case, gradient echo sequences are preferably used. It is noted again that the different excitation modes are presently selected so that more than one transmission channel is used, such that the dynamic range of the B1 amplitudes is reduced relative to the use of a single transmission channel in order to this also already optimally achieve an extensive, uniform coverage of the imaging region of the magnetic resonance for the individual excitation modes.

FIG. 3 shows a basic drawing of a magnetic resonance (MR) device 6 according to the invention, wherein for the sake of simplicity only the components that are relevant to the present invention are actually shown, and a depiction of the basic magnetic field unit, the gradient coil arrangement and the like is omitted for clarity. The magnetic resonance device 6 has a radio-frequency (RF) coil arrangement (indicated at 7) that can be operated by a transmission device 9 via multiple schematically depicted transmission channels 8 such that an amplitude and a phase can be independently selected for each transmission channel 8. Like the other components of the magnetic resonance device 6 that are not presented in detail here, the transmission system—formed by the radio-frequency coil arrangement 7 and the transmission device 9—is controlled by a control device 10, which is designed to implement the method according to the invention and is shown in detail in FIG. 4.

The control device 10 thus has a sequence controller 11 via which the excitation modes (and possibly other excitations) can be realized within the scope of the present invention in order to obtain the magnetic resonance data. The magnetic resonance data are initially evaluated in an evaluation unit 12 with regard to Nyquist phase wrapping (see step 4), whereupon a B0 field map determination unit 13 determines the B0 field map according to step 5. Finally, a B1 field map determination unit 14 to determine the B1 field maps is also shown for the control device 10.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method of determining a B0 field map that describes a local deviation from a nominal Larmor frequency of a magnetic resonance (MR) data acquisition device, comprising:

operating said MR data acquisition device in order to generate a plurality of different excitation fields that each excite nuclear spins in a subject, and in order to acquire MR signals from the subject in respective signal acquisitions that each occur at two different echo times, among a plurality of echo times that occur after a respective excitation of the nuclear spins in the subject with one of the different excitation fields, with each difference between each two different echo times, following the respective excitation, forming a dephasing time that causes the respective MR signals that occur at said two different echo times to have respectively different phases, thereby resulting in a plurality of different dephasing times after the respective excitation;

providing said MR signals to a computerized processor and, in said computerized processor, determining a phase change represented by said acquired MR signals from a phase difference of the respective MR signals acquired at said different echo times, and thereby resulting in a plurality of phase changes, and evaluating the phase changes of said different dephasing times in order to reduce an ambiguity due to Nyquist phase wrapping; and in said processor, using the phase changes of the different dephasing times in order to generate said B0 field map, and making said B0 field map available in electronic form at an output of said processor.

2. A method as claimed in claim 1 comprising operating said MR data acquisition device with a total number of said excitations of nuclear spins configured to homogeneously encompass an imaging region within said MR data acquisition device.

3. A method as claimed in claim 1 comprising operating said MR data acquisition device wherein a predetermined minimum signal strength, of the MR signals emitted by the excited nuclear spins, is exceeded in at least one of said excitations for each voxel in an imaging region of the MR data acquisition device.

4. A method as claimed in claim 1 comprising operating said MR data acquisition device with a total number of said excitations of nuclear spins configured to homogeneously encompass an imaging region within said MR data acquisition device, and wherein a predetermined minimum signal strength, of the MR signals emitted by the excited nuclear spins, is exceeded in at least one of said excitations for each voxel in said imaging region of the magnetic resonance data acquisition device.

5. A method as claimed in claim 1 wherein said MR data acquisition device comprises a radio frequency coil arrangement comprising multiple, independently controllable transmission channels, and operating said MR data acquisition device in order to produce said excitations by independent control of the respective transmission channels, and, in said processor, determining a B1 map for each of said transmission channels from the acquired MR signals from the respective channels.

6. A method as claimed in claim 5 comprising operating said MR data acquisition device in order to excite said nuclear spins with respectively different excitation modes with the independently controllable transmission channels, and in order to acquire said MR signals in at least two acquisitions respectively implemented at different echo times for each excitation mode, wherein said dephasing times differ in an equal number of said different excitation modes.

7. A method as claimed in claim 6 comprising operating said MR data acquisition device in order to generate said excitation modes using more than one of said transmission channels and thereby reducing a dynamic range of B1 amplitudes relative to a transmission mode generated by a single one of said transmission channels.

8. A method as claimed in claim 1 comprising operating said MR data acquisition device with a gradient echo sequence in order to acquire said MR signals.

9. A magnetic resonance (MR) apparatus comprising:
an MR data acquisition device comprising a basic field magnet that generates a B0 field exhibiting local deviations from a nominal Larmor frequency of said MR data acquisition unit;
a control unit configured to operate said magnetic resonance data acquisition device in order to generate a plurality of different excitation fields that each excite nuclear spins in a subject, and in order to acquire MR signals from the subject in respective signal acquisitions that each occur at two different echo times, among a plurality of echo times that occur after a respective excitation of the nuclear spins in the subject with one of the different excitation fields, with each difference between each two different echo times, following the respective excitation, forming a dephasing time that causes the respective MR signals that occur at said two different echo times to have respectively different phases, thereby resulting in a plurality of different dephasing times after the respective excitation;
a computerized processor provided with said acquired MR signals, said computerized processor being configured to determine a phase change represented by said acquired MR signals from a phase difference of the MR signals acquired at said different echo times, and thereby resulting in a plurality of phase changes, and to evaluate the phase changes of said different dephasing times in order to reduce an ambiguity due to Nyquist phase wrapping; and
said processor being configured to use the phase changes of the different dephasing times in order to generate a B0 field map that describes a local deviation from a nominal Larmor frequency of the MR data acquisition device, and in order to make said B0 field map available in electronic form at an output of said processor.

10. An apparatus as claimed in claim 9 wherein said MR data acquisition device comprises a radio frequency coil arrangement comprising multiple, independently controllable transmission channels, and wherein said control unit is configured operate said MR data acquisition device in order to produce said excitations by independent control of the respective transmission channels, and wherein said processor is configured to determine a B1 map for each of said transmission channels from the acquired MR signals from the respective channels.

11. An apparatus as claimed in claim 10 wherein said control unit is configured to operate said MR data acquisition device in order to excite said nuclear spins with respectively different excitation modes with the independently controllable transmission channels, and configured to acquire said MR signals in at least two acquisitions respectively implemented at different echo times for each excitation mode, wherein said dephasing times differ in an equal number of said different excitation modes.

12. An apparatus as claimed in claim 11 wherein said control unit is configured to operate said MR data acquisition unit in order to generate said excitation modes using more than one of said transmission channels and thereby reducing a dynamic range of B1 amplitudes relative to a transmission mode generated by a single one of said transmission channels.

* * * * *